(12) United States Patent
Emerson et al.

(10) Patent No.: US 11,270,939 B2
(45) Date of Patent: Mar. 8, 2022

(54) ADDITIVELY MANUFACTURED PROGRAMMABLE RESISTIVE JUMPERS

(71) Applicant: TEXAS INSTRUMENTS INCORPORATED, Dallas, TX (US)

(72) Inventors: Paul Merle Emerson, Madison, AL (US); Benjamin Stassen Cook, Los Gatos, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/866,255

(22) Filed: May 4, 2020

(65) Prior Publication Data

US 2020/0266145 A1    Aug. 20, 2020

Related U.S. Application Data

(63) Continuation of application No. 16/048,774, filed on Jul. 30, 2018, now Pat. No. 10,643,944.

(51) Int. Cl.
| | |
|---|---|
| *H01L 23/525* | (2006.01) |
| *H01L 49/02* | (2006.01) |
| *H01L 21/66* | (2006.01) |
| *H01L 21/288* | (2006.01) |
| *H01L 23/64* | (2006.01) |
| *H01L 21/78* | (2006.01) |

(52) U.S. Cl.
CPC ........ *H01L 23/5256* (2013.01); *H01L 21/288* (2013.01); *H01L 21/78* (2013.01); *H01L 22/14* (2013.01); *H01L 23/647* (2013.01); *H01L 28/20* (2013.01)

(58) Field of Classification Search
None
See application file for complete search history.

(56) References Cited

U.S. PATENT DOCUMENTS

| | | |
|---|---|---|
| 2006/0103554 A1 | 5/2006 | Jones |
| 2010/0167427 A1 | 7/2010 | Howard et al. |
| 2014/0177456 A1 | 6/2014 | Boudreau et al. |
| 2015/0249453 A1 | 9/2015 | Harrington et al. |
| 2016/0004269 A1 | 1/2016 | Ivanov |
| 2016/0295696 A1 | 10/2016 | Cook et al. |
| 2017/0149397 A1 | 5/2017 | Roy et al. |
| 2017/0154811 A1 | 6/2017 | Wu et al. |
| 2017/0288622 A1 | 10/2017 | Tan et al. |

*Primary Examiner* — Robert G Bachner
*Assistant Examiner* — Molly K Reida
(74) *Attorney, Agent, or Firm* — Valerie M. Davis; Charles A. Brill; Frank D. Cimino

(57) ABSTRACT

A first conductive routing structure is electrically connected to a first electronic component. A second conductive routing structure is electrically connected to a second electronic component. An additive deposition process deposits a material over a surface of a processed wafer to form a conductive or resistive structure, which extends from a portion of the first conductive routing structure to a portion of the second conductive routing structure, to configure a circuit including the first and second electronic components.

19 Claims, 7 Drawing Sheets

ADDITIVELY MANUFACTURED PROGRAMMABLE RESISTIVE JUMPERS

CROSS-REFERENCE TO RELATED APPLICATION

This application is a continuation of U.S. patent application Ser. No. 16/048,774 filed Jul. 30, 2018, the entirety of which is incorporated herein by reference.

BACKGROUND

Analog and digital circuits can be adjusted during manufacturing to set circuit performance parameters and/or to change circuit configurations. Fuses, electrically erasable programmable read-only memory (EEPROM) and one-time programmable (OTP) memories can be used for trimming and/or programmed different product options during manufacturing of microelectronic devices. However, those memory elements and/or fuses often require extra masking steps and more die area, cost and complexity, which limit product flexibility and reliability, and/or which require precision special multiple pass test and programming procedures to ensure reliability.

SUMMARY

A first conductive routing structure is electrically connected to a first electronic component. A second conductive routing structure is electrically connected to a second electronic component. An additive deposition process deposits a material over a surface of a processed wafer to form a conductive or resistive structure, which extends from an exposed portion of the first conductive routing structure to an exposed portion of the second conductive routing structure, to configure a circuit including the first and second electronic components.

DETAILED DESCRIPTION OF EXAMPLE EMBODIMENTS

Figure 1:
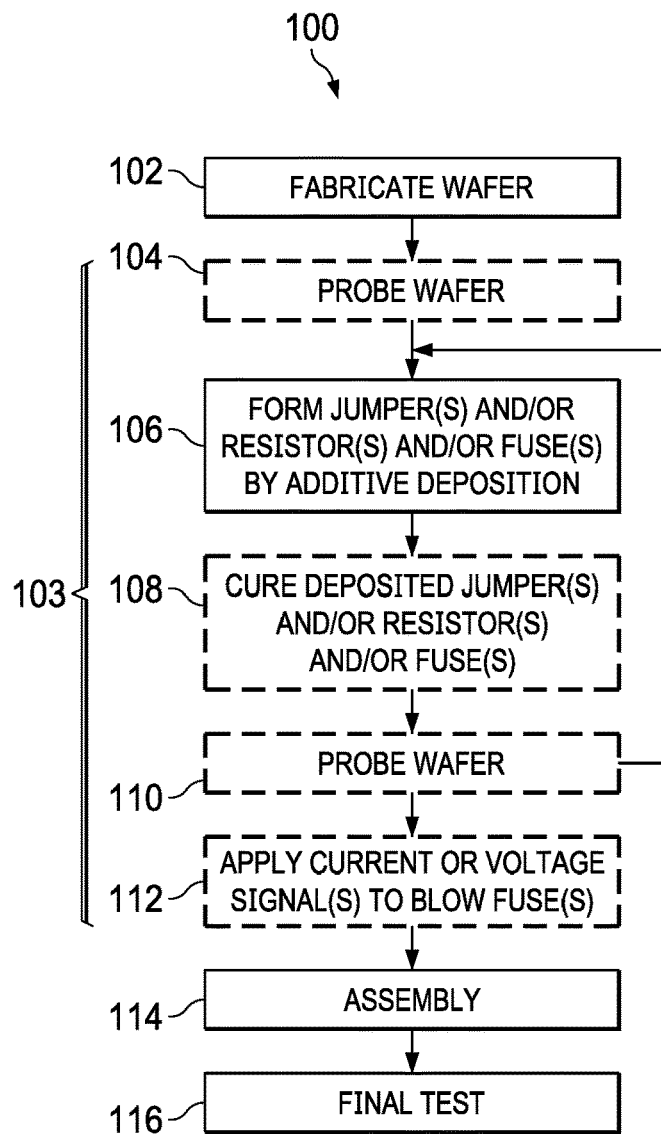
FIG. 1 is a flow diagram of a method of manufacturing a microelectronic device.

In the drawings, like reference numerals refer to like elements throughout, and the various features are not necessarily drawn to scale. Also, in this description, the term "couple" or "couples" is includes indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows a method 100 of manufacturing and configuring a microelectronic device, such as a microelectronic device having an integrated circuit (IC). Unlike fuses, EEPROMs or OTP memories, the method 100 uses printing or other additive deposition processing to form conductive or resistive material structures over a first surface (e.g., a top surface) of a processed wafer (such as a silicon wafer or silicon-on-insulator ("SOI") wafer) to configure a circuit of electronic components of the wafer. Described examples facilitate trimming analog circuits, and programming digital and analog circuits to set or modify circuit configuration after wafer processing, before singulation and packaging during microelectronic device manufacturing. The method 100 includes fabricating a wafer at 102, and configuring circuitry of electronic components of the processed wafer at 103, before final assembly and packaging. The wafer fabrication at 102 includes forming electronic components on or in a semiconductor substrate, and metallization processing to form a metallization structure over the substrate. The metallization processing includes forming one or more dielectric layers with conductive routing structures connected to one or more of the electronic components to provide a processed wafer with a top surface that exposes two or more of the conductive routing structures. The metallization structure's top surface is not required to be planar. In some examples, the top surface exposes a conductive routing structure of an upper-most metallization layer, and also exposes a conductive routing structure of a different (e.g., lower) metallization layer. The wafer fabrication at 102 includes forming a passivation layer over select portions of the first surface of the wafer. Where used, the passivation layer formation covers select portions of the top surface and leaves portions of the conductive routing structures exposed.

The example manufacturing method 100 includes a circuit configuration method 103. The processing at 103 includes configuring circuitry of the electronic components of the processed wafer using additive deposition. The configuration processing at 103 includes performing a first wafer probe test at 104 that measures a parameter of the circuitry of the electronic components. The processed wafer includes multiple die areas that will ultimately be singulated into separate integrated circuit dies for subsequent packaging to form microelectronic devices. In this example, each die area includes: (a) one or more electronic components formed on or in the die area's respective portion of the semiconductor substrate of the processed wafer; and (b) conductive routing structures of the metallization structure to provide external access for electrical interconnection by a probe machine. The first wafer probe testing at 104 can include: (a) application of probe signals to one or more probed electrical connections; and (b) measurement of one or more parameters associated with circuitry of the electronic components of the processed wafer. The probe test at 104 identifies operability and performance parameters of die areas and the associated circuitry thereof. The probe test can identify any malfunctioning circuits. If a die area's respective circuits include features for self-repair (e.g., spare memory cells), then the die area can be identified for subsequent self-repair through additive deposition as described further below. For each die area of the processed wafer, the first probe testing 104 collects respective trim or configuration data to identify locations for subsequent additive deposition to set or modify a circuit configuration of the wafer.

At 106, the method 100 further includes depositing a material on the top surface of the wafer from an exposed portion of the first conductive routing structure to an exposed portion of the second conductive routing structure to configure the circuitry of the electronic components. The location and/or material used in the deposition at 106 is determined at least partially according to (e.g., in response to or based upon) one or more parameters measured during any wafer probe processing portion of 104. In this manner, the measured circuit condition of the processed wafer is selectively adjusted or set according to the wafer probe results. The additive deposition at 106 provides a controlled formation of one or more structures connected between two or more exposed conductive routing structures of the wafer metallization structure. The deposited structures operate as jumpers and/or resistors to modify or set a circuit configuration in the die. The additively deposited material forms an ohmic contact to the exposed portion of the conductive routing structure of the metallization layer or layers. The additively deposited material is tailored to create an ohmic contact with a controlled metal-metal interface to the material of the conductive routing structure (e.g., aluminum, copper, etc.) without creating a Schottky diode.

The deposition at 106 includes depositing a first conductive material to form a conductive jumper between the exposed portion of the first conductive routing structure and the exposed portion of the second conductive routing structure. The deposition at 106 includes depositing a resistive material to form a resistor or fuse between the exposed portion of the first conductive routing structure and the exposed portion of the second conductive routing structure. The deposition at 106 includes depositing a semiconductor material to form a semiconductor structure between the exposed portion of the first conductive routing structure and the exposed portion of the second conductive routing structure. The deposition at 105 includes performing a printing process or other additive deposition process to form the material. The printing process at 106 is an ink jet process. In another example, the printing process at 106 is an electrostatic jet process. In another example, the printing process at 106 is a jet dispense process. In another example, the printing process at 106 is a laser assisted deposition process. In another example, the printing process at 106 is a spray process. In another example, the printing process at 106 is a screen printing process. Multiple printing processes are performed at 106.

In the example method 100 of FIG. 1, a cure process is performed at 108 to cure the material deposited at 106. The processing at 108 includes pre-baking the wafer and exposing the deposited material to ultraviolet (UV) light to facilitate drying and establishing a desired material property of the first deposited material. In other implementations, the optional cure processing at 108 can be omitted.

The example method 100 of FIG. 1 includes performing a second wafer probe test at 110 after the additive deposition processing at 106. The second wafer probe test at 110 measures the circuit parameter or parameters that were tested in the first wafer probe at 104. Further additive deposition can be performed along with any cure processing portion of 106 and 108, according to (e.g., in response to or based upon) the results of the second wafer probe test at 110. In other examples, the second wafer probe processing at 110 can be omitted.

At 112, the example method 100 further includes applying a voltage signal or a current signal to the deposited material to disconnect the first conductive routing structure from the second conductive routing structure. The material printed at 106 creates an electrical fuse: (a) between two conductive routing structures; and (b) therefore, between electrical components that are respectively connected to those two conductive routing structures. The fuse material can be resistive to operate as a jumper for resistive interconnection of the associated electrical components, or the fuse material can be opened (e.g., blown) at 112 by providing a voltage or current signal between the conductive routing structures or between other externally accessible conductive features of the wafer. In another example, the material printed at 106 creates an electrical resistor: (a) between two conductive routing structures; and (b) therefore, between electrical components that are respectively connected to those two conductive routing structures. All or a portion of the resistive material can be removed, such as by laser trimming at 112, to adjust the circuitry of the electronic components. For example, a resistive material can be additively deposited with an initial width at 106, and thereafter laser trimming can be used at 112 to narrow the deposited resistive material, thereby increasing the resistance. This facilitates fine-tuning and trimming of circuit performance parameters before or after IC packaging to correct for any changes in performance introduced to the circuit by mechanical stress from the assembly and packaging of the IC. In the illustrated example, the desired fuse or fuses is/are blown at 112 before assembly and packaging at 114. In other examples, the current or voltage signal is applied following the assembly processing at 114. In yet another example, the signal application process at 112 can be omitted. The initial wafer probe operations at 104 and/or the subsequent wafer probe processing at 110 include(s) an optical probe to identify topographic features of the top surface 219 of the processed wafer 200, and the additive deposition processing at 106 is adjusted to preferentially deposit material structures (e.g., conductive material, resistive material, semiconductor material, etc.) in the identified valleys or low-lying areas of the top surface 219. Accordingly, some fabrication processes at 102 include planarizing the top surface 219, and other wafer fabrication processing at 102 omits top surface planarization processing, leaving high and low topographic features on the top surface 219. In some implementations, the additive deposition at 106 preferentially deposits material in low-lying regions between steps on the top surface 219. In one implementation, the low-lying regions are identified through optical wafer probing at 104 and/or 110. One example implementation includes detecting characteristics of the surface at 110 and modifying the additive process at 106 to adjust for differences in the surface die to die for a specific region of the wafer that is going to be modified.

Following the configuration processing at 103 (e.g., steps 104-112 in FIG. 1), the example manufacturing method 100 includes assembly processing at 114. The assembly processing includes one or more of back grinding the processed wafer, sawing or laser cutting the wafer to singulate the wafer into separate dies that include respective circuits formed by the electronic components, die attach processing to attach each die to a respective lead frame, wire bonding to attach bond wires to the die and lead frame features, cleaning processes, such as a plasma cleaning step (e.g., $Ar/O_2$), and molding operations to form a finished microelectronic device (e.g., a microelectronic device having an integrated circuit). At 116, final testing is performed to verify operation of the finished microelectronic device. The assembly processing at 114 includes forming a passivation layer (e.g., 230 in FIG. 2) over the top surface, to cover all or at least a portion of the additively deposited material formed at 106. Where the deposited material includes silver, the formation of an additional passivation layer over the additively deposited silver facilitates prevention or mitigation of silver migration. The subsequently formed passivation material can be deposited using any suitable process, including additive deposition (e.g., printing), chemical vapor deposition (CVD) to deposit a nitride or oxynitride passivation material, etc.

Figure 2:
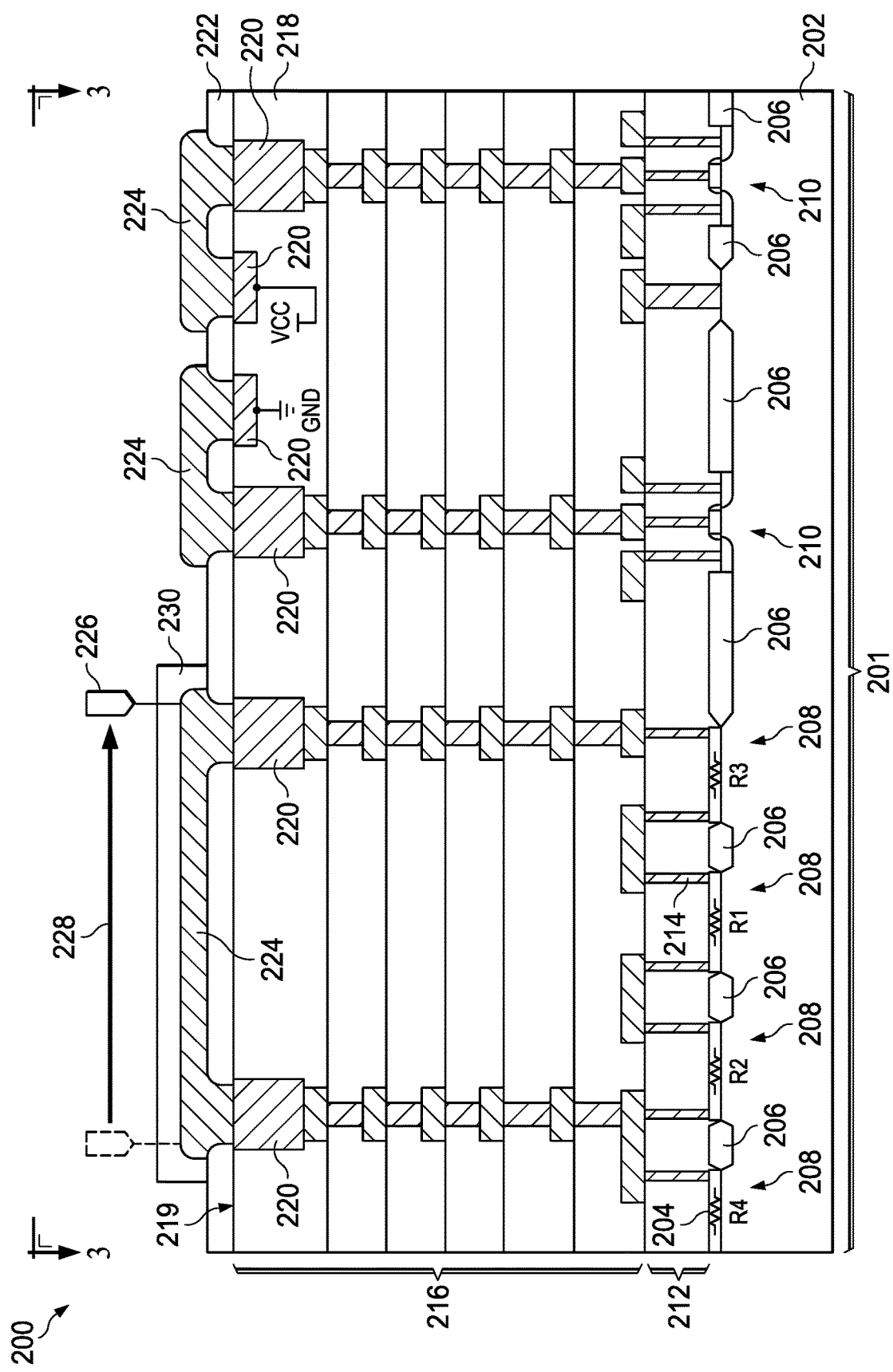
FIG. 2 is a partial side elevation view of a processed wafer with deposited conductive material to connect metallization structure features to configure circuitry of the wafer.

FIG. 2 shows an example microelectronic device during manufacturing according to the example method 100. A processed wafer 200 is shown in FIG. 2, including an example die portion or die area 201. As described above, the wafer 200 is processed as a unitary structure, including the example additive deposition processing (e.g., 106 in FIG. 1), and subsequently singulated into separate dies 201. The device in FIG. 2 includes a semiconductor substrate 202 (e.g., a silicon wafer, SOI wafer, etc.), and a number of electronic components are formed on or in the substrate 202. In the illustrated example, polysilicon structures 204 are formed over and upper surface of the substrate 202, and isolation structures 206 (e.g., field oxide structures, shallow trench isolation (STI) structures, etc.) are formed to isolate selected regions or areas of the substrate 202. One or more portions of the substrate 202 and/or of the polysilicon structures 204 are selectively implanted with p-type or n-type impurities or dopants using conventional semiconductor processing techniques and apparatus to form one or more electronic components. Some of the polysilicon structures 204 provide polysilicon resistors 208, and the illustrated example further includes a number of field effect transistors (e.g., MOSFETs) 210 formed on or in the substrate 202. FIG. 2 shows the example labels for some of the polysilicon resistors, including resistors R1, R2, R3 and R4. Other types and forms of electronic components can be formed on or in the substrate and/or subsequently-formed metallization structures, such as inductors, capacitors, etc.

A first metallization layer 212 is formed over the upper surface of the substrate 202, the polysilicon structures 204 and the isolation structures 206. The first metallization layer or level 212 is referred to as a pre-metallization dielectric (PMD) layer, and can be any suitable dielectric material, such as silicon dioxide ($SiO_2$). Conductive contacts 214 are formed of suitable conductive material (e.g., tungsten (W), copper (Cu), etc.) through the PMD layer 212 to form ohmic conductive contacts to select portions of the electronic components 208, 210. One or more additional metallization layers, referred to as inter-layer dielectric (ILD) layers, are formed over the PMD layer 212 to provide a single or multi-layer structure 216. The metallization structure 212, 216 includes a final or uppermost ILD dielectric layer 218 with a top or upper surface 219. The ILD layers 216 include conductive routing structures to form interconnections through associated PMD layer contacts 214 to interconnect various electronic components of the wafer 200 to one another, and to provide external connectivity to various ones of the electronic component features. Conductive routing structures 220 (e.g., copper) have upper surfaces exposed through the top or upper surface 219 of the final ILD layer 218. The illustrated example includes a passivation layer 222 (e.g., oxide, oxynitride, polyamide, nitride material, etc.) formed over select portions of the top ILD layer 218. The passivation layer 222 exposes portions of the tops of the illustrated conductive routing structures 220.

In the example of FIG. 2, the metallization structure 212, 216 includes first and second conductive routing structures 220 electrically connected to a particular ones of the resistors 208, including: (a) a first (left-most) conductive routing structure 220 connected to a node that joins the resistors R2 and R4; and (b) a second conductive routing structure 220 connected to a first end of the resistor R3. Conductive or resistive or semiconductive connection of the first and second conductive routing structures 220 to one another by additive deposition of a material 224 electrically connects the first end of the resistor R3 to the node that joins the resistors R2 and R4. In the example of FIG. 2, the processing at 106 is used to form a conductive material 224 between the conductive routing structures 220 to provide an ohmic contact between the first end of the resistor R3 and the node that joins R2 and R4. Examples of suitable deposited conductive materials 224 include nanoparticle materials, sol-gel, metal-salt decomposition or the like. This electrically connects R3 in parallel with the series combination of R1 and R2, and thus changes the circuit configuration of the resistor components 208. The illustrated example also includes conductive routing structures 220 electrically connected to the gates of the example transistors 210. Also, specific conductive routing structures 220 are connected to a reference voltage node (e.g., labeled GND in FIG. 2), and to a supply voltage node (e.g., labeled VCC in FIG. 2). Although the example of FIG. 2 illustrates formation of structures 224 between exposed portions of that are in an upper-most metallization layer 218, the additive deposition processing at 106 is useful in other examples to form structures (e.g., conductive structures 224) that connect to conductive routing structures in different layers of a multi-layer metallization structure 216, such as where the top or first surface 219 of the metallization structure 212, 216 includes openings that expose portions of such conductive routing structures of various metallization layers.

The processing at 106 creates a conductive material 224 that connects the gate of one of the transistor components 210 to the ground reference GND, and forms a second structure 224 that connects the gate of the other transistor 210 to the supply voltage VCC. In this manner, the selective additive deposition of the material structures 224 over the top surface 219 of the metallization structure 212, 216 sets or adjusts the circuit configuration of the electronic components in the illustrated die area 201 of the wafer 200. FIG. 2 also illustrates the use of a spray or printing process with a print head or spray nozzle 226 during the creation of one of the conductive material structures 224. In this example, the deposition system translates the print head or spray nozzle 226 from left to right along the direction 228 in FIG. 2, in order to deposit the material 224 extending between the selected conductive routing structures 220. FIG. 2 further illustrates an example second passivation structure 230 formed over one of the additively deposited conductive material structures 224.

Figure 3:
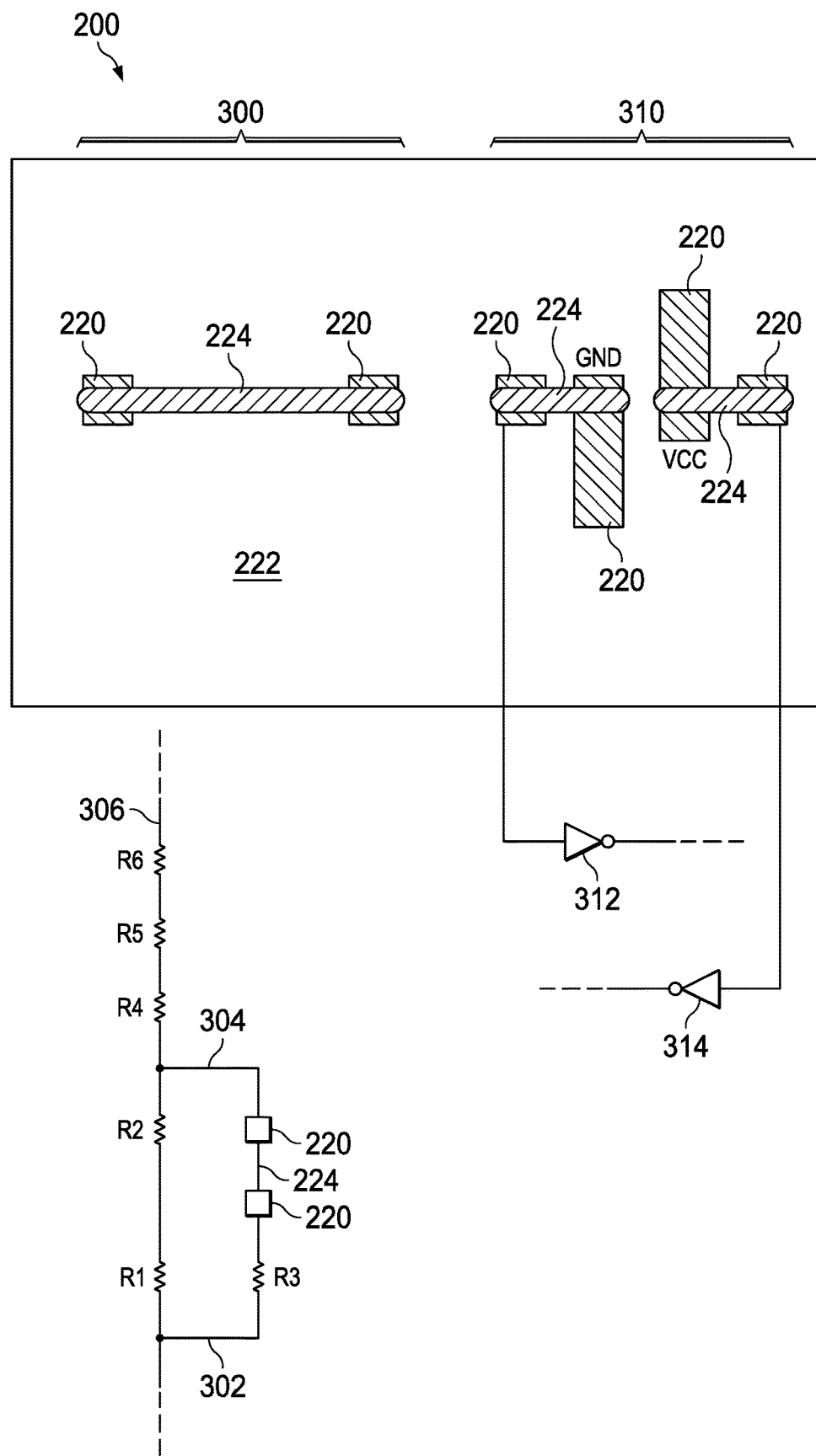
FIG. 3 is a partial top plan view of the wafer of FIG. 2 with schematically illustrated circuitry.

FIG. 3 shows a partial top view of the wafer 200 taken along line 3-3 of FIG. 2, including upper portions of the conductive routing structures 220 exposed through the passivation layer 222. FIG. 3 also shows the deposited conductive material structures 224 joining selected pairs of the conductive routing structures 220. Also, FIG. 3 schematically shows circuit connections provided by the conductive structures 224 to configure an analog circuit 300 and a digital circuit 310.

The analog (e.g., resistive) circuit 300 in FIG. 3 is formed by the series connection of resistor components 208, labeled R1, R2, R4, R5 and R6 in the schematic illustration of FIG. 3. The resistors R1 and R2 are connected between the circuit nodes 302 and 304, and the resistors R4-R6 are connected in series with one another between the node 304 and a further node 306. The bottom terminals or legs of the resistors R1 and R3 are connected to one another in the metallization structure 216 in FIG. 2 to form the illustrated circuit node 302. The additive deposition of the structure 224 between a first conductive routing structure 220 (connected to the upper terminal of R3) and a second conductive routing structure 220 (connected to the node that joins R2 and R4) connects the resistor R3 in parallel with the series combination of R1 and R2. This sets or modifies the resistance in the circuit between the nodes 302 and 306. Conversely, the omission of this additivity deposited structure 224 provides a different resistance between the nodes 302 and 306.

The digital circuit 310 in FIG. 3 includes two or more inverters 312, which include the transistor components 210. The inverters 312 include outputs that provide Boolean signals (e.g., having a first state or a different second state), which can be used to program or configure a larger digital circuit and/or an analog circuit. The input to the first inverter 312 is connected to a first conductive routing structure 220, and the example deposited material structure 224 provides an ohmic electrical connection of the inverter input to conductive routing structure 220 connected to the reference voltage node (GND). After manufacturing, the microelectronic device formed using the example of die will be programmed by a high signal at the output of the inverter 312 as a result of the additive deposition of the conductive material structure 224 during manufacturing. The second illustrated inverter 314 includes an input (e.g., the gate of one of the transistor components 210 in FIG. 2) electrically connected through the metallization structure 212, 216 to a respective conductive routing structure 220. The additivity deposited conductive material structure 224 in FIG. 3 provides an ohmic electrical contact between the input of the inverter 314 and the supply voltage conductive routing structure 220. In operation of the resulting microelectronic device, the output of the inverter 314 will provide a low electrical signal.

Figure 4:
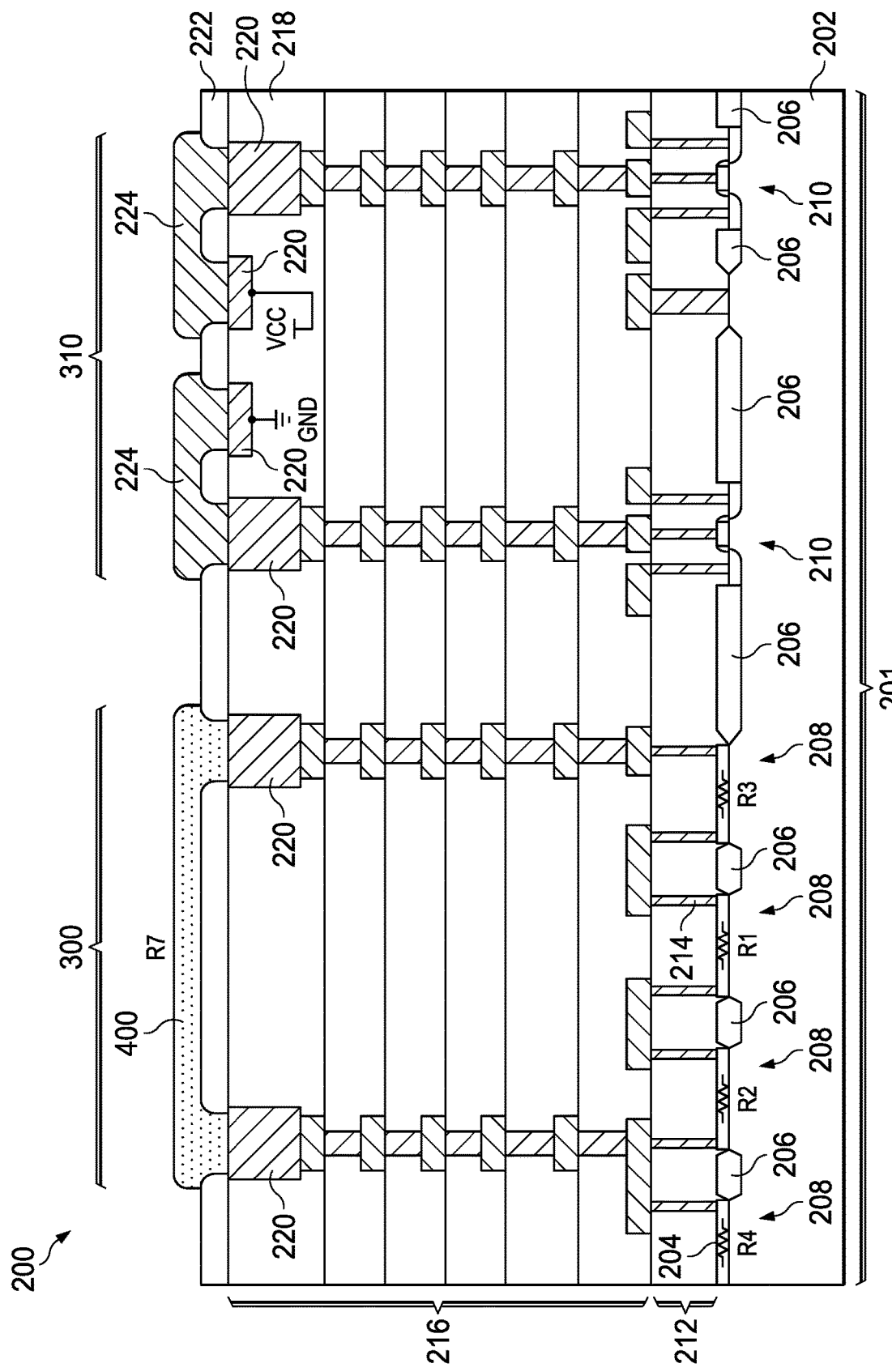
FIG. 4 is a partial side elevation view of a processed wafer with deposited resistive material to provide a resistor between metallization structure features to configure circuitry of the wafer.

FIG. 4 shows another example of the processed wafer 200, generally as described above in connection with FIG. 2. In this example, the additive deposition processing at 106 in FIG. 1 forms conductive material structures 224 to configure the digital circuit 310 as described above in connection with FIGS. 2 and 3. In this example, the additive deposition processing at 106 in the method 100 of FIG. 1 deposits a resistive material 400 that extends from a first conductive routing structure 220 (connected to the node 304 in FIG. 3) to the second conductive routing structure 220 (connected to the node 302). Examples of suitable resistor materials 400 include carbon-based materials and all allotropes thereof, polymer filled with carbon/conductive particles, solution deposited metals, etc. This creates a new resistor R7 in series with R3, and this series combination is connected in parallel with the series combination of R1 and R2 (between the nodes 302 and 304 in FIG. 3). This example provides a different resistance between the nodes 302 and 304 than the additive printing of a conductive material structure 224 as shown in FIGS. 2 and 3. Accordingly, the processing at 106 in FIG. 1 can include performance of multiple additive deposition processes, such as: (a) a first additive deposition of a conductive material 224 to configure the digital circuit 310; and (b) a second additive deposition of a resistive material 400 to configure the analog circuit 300.

Figure 5:
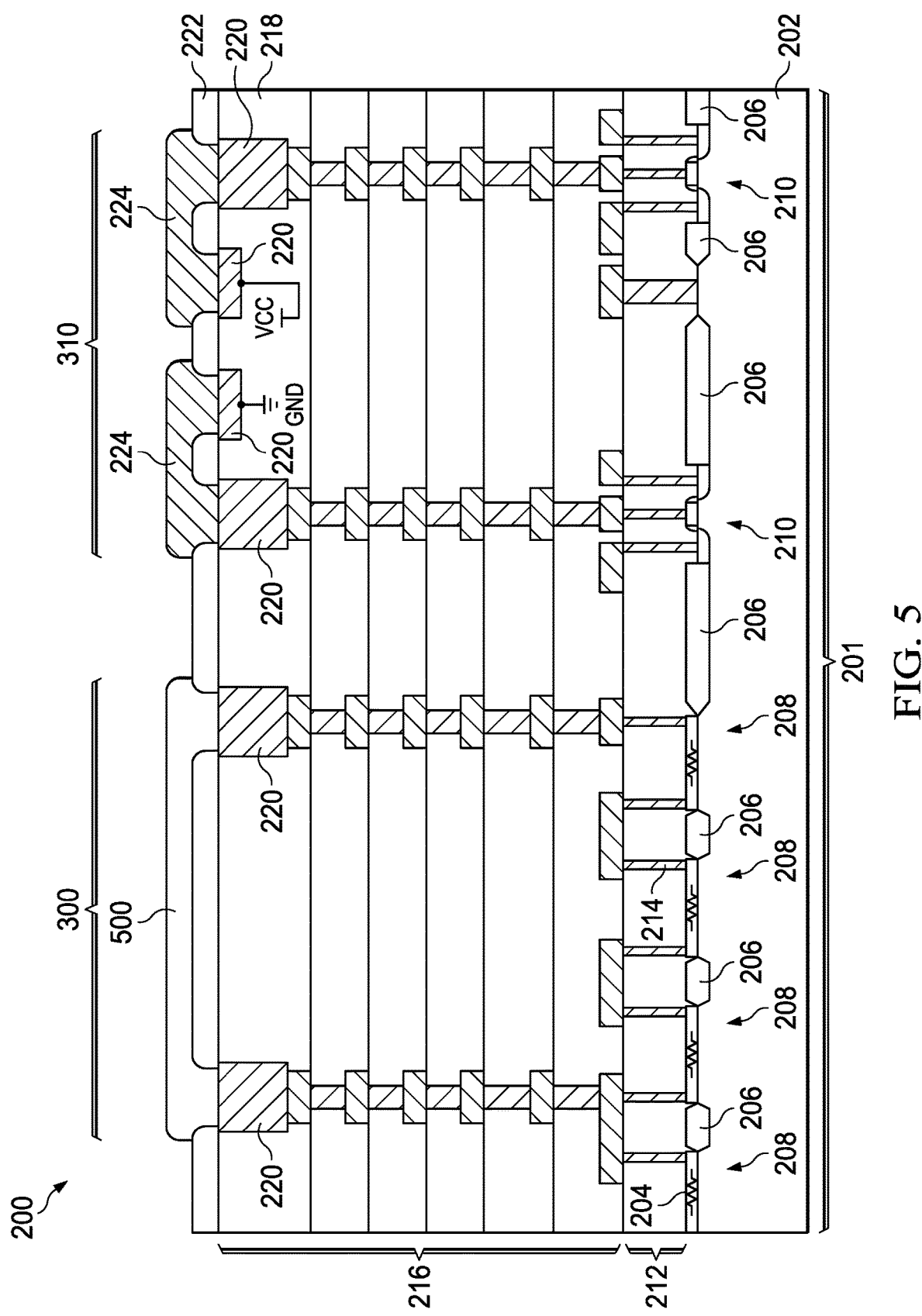
FIG. 5 is a partial side elevation view of a processed wafer with deposited semiconductor material to connect metallization structure features to configure circuitry of the wafer.

FIG. 5 shows yet another example of the processed wafer 200, generally as described above in connection with FIG. 2. In this further example, the additive deposition processing at 106 forms the conductive material structures 224 to configure the digital circuit 310, and also deposits a semiconductive material 500 that extends from the first conductive routing structure 220 (connected to the node 304 in FIG. 3) to the second conductive routing structure 220 (connected to the node 302). Examples of suitable semi conductive materials 500 include silicon and solids or liquid solutions that include silicon. This example creates a semiconductor structure between the upper terminal of the resistor R3 and the node 304 in the analog circuit 300 of FIG. 3. Two different semiconductor depositions are performed to create the illustrated structure 500 to create a diode between the first and second conductive routing structures 220 in the analog circuit 300.

Figure 6:
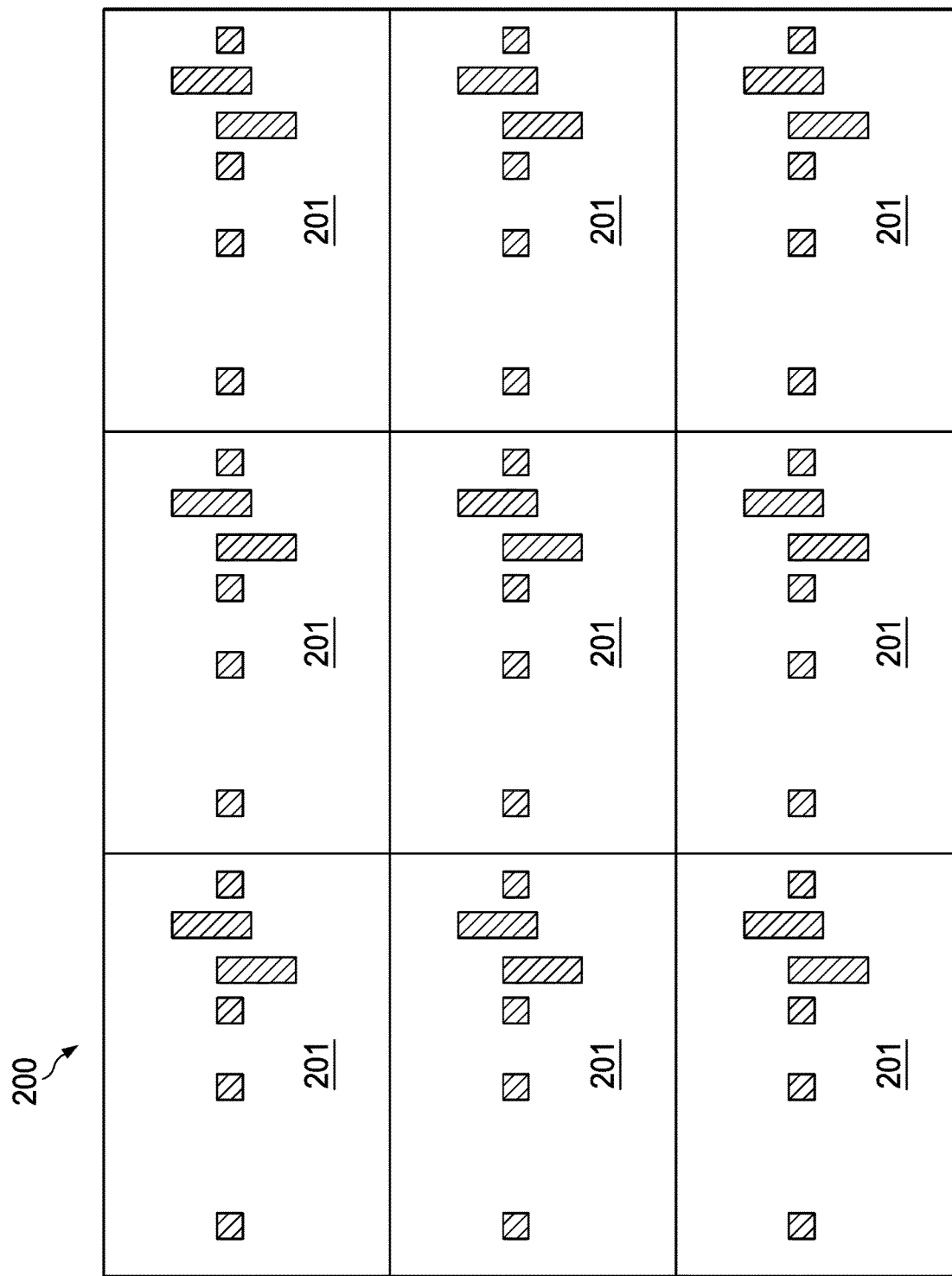
FIG. 6 is a partial top plan view showing several die areas of a processed wafer before additive deposition.

FIG. 6 shows a top view of several die areas 201 of the processed wafer 200 after the wafer fabrication at 102 and before the additive deposition processing at 106 in FIG. 1. At this stage of the manufacturing process, the tops of the conductive routing structures 220 are exposed through openings in any passivation layer at the top surface 219 of the upper-most metallization structure dielectric layer 218, generally as described above in connection with FIG. 2. In this example, the additive deposition processing at 106 in FIG. 1 forms conductive material structures 224 to configure the digital circuit 310 as described above in connection with FIGS. 2 and 3. In this example, the additive deposition processing at 106 in the method 100 of FIG. 1 deposits a resistive material 400 that extends from a first conductive routing structure 220 (connected to the node 304 in FIG. 3) to the second conductive routing structure 220 (connected to the node 302). This creates a new resistor R7 in series with R3, and this series combination is connected in parallel with the series combination of R1 and R2 (between the nodes 302 and 304 in FIG. 3). This example provides a different resistance between the nodes 302 and 304 than the additive printing of a conductive material structure 224 as shown in FIGS. 2 and 3. Accordingly, the processing at 106 in FIG. 1 can include performance of multiple additive deposition processes, such as: (a) a first additive deposition of a conductive material 224 to configure the digital circuit 310; and (b) a second additive deposition of a resistive material 400 to configure the analog circuit 300.

Figure 8:
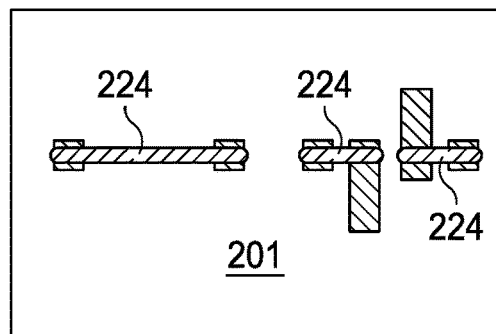
FIG. 8 is a partial top plan view showing a singulated die of the wafer of FIGS. 6 and 7.
Figure 7:
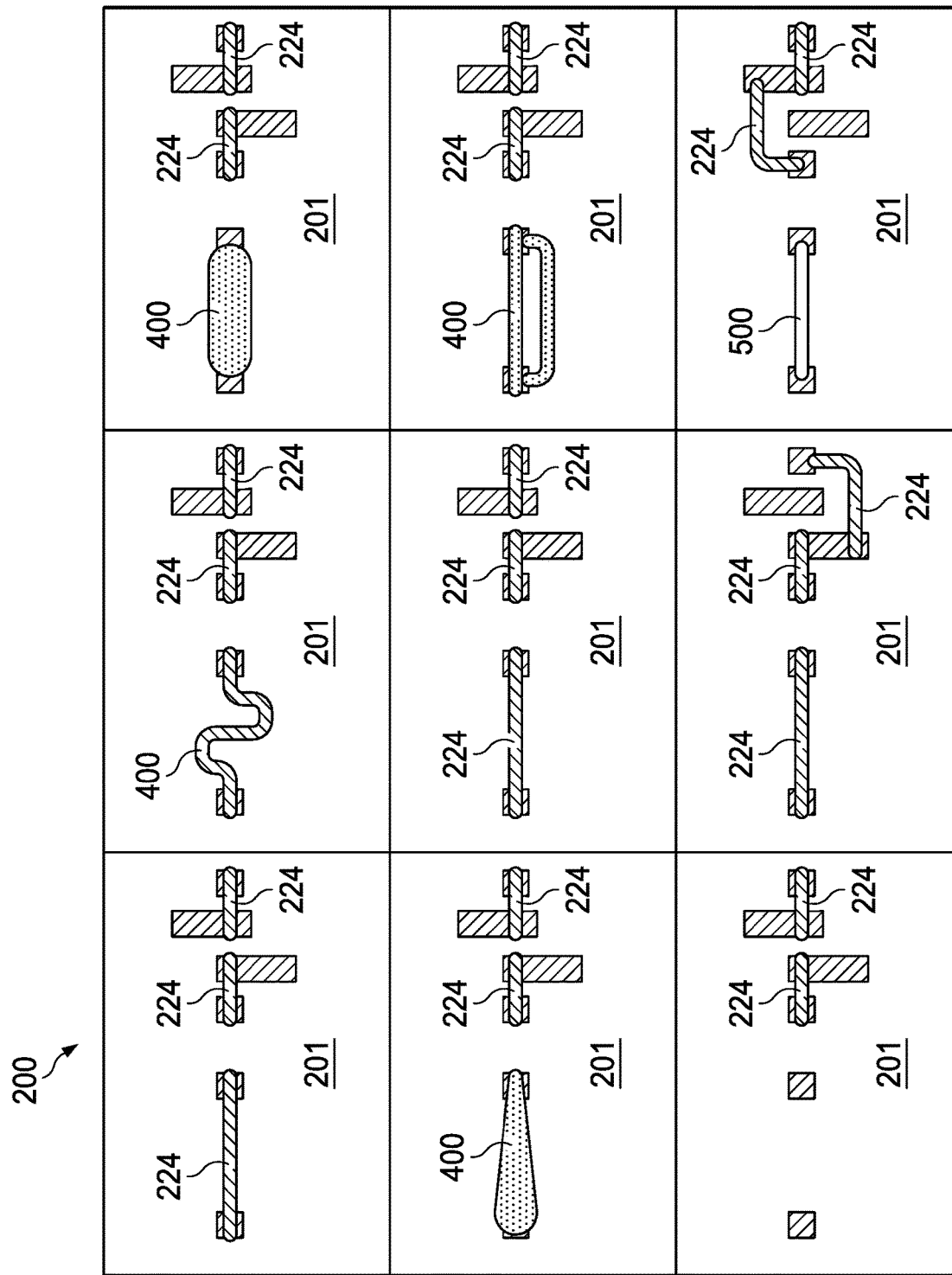
FIG. 7 is a partial top plan view showing additively deposited conductive, resistive and semiconductor structures formed between metallization structure features to configure circuitry of the wafer of FIG. 6.

Based on wafer probe testing at 104, or a predetermined fabrication process, the additive deposition processing is performed at 106 in FIG. 1 to provide the wafer structure 200 illustrated in FIG. 7. In this example, various different material structures 224, 400 and 500 have been additively deposited over the metallization structure to provide conductive, resistive and/or semiconductive interconnections between various pairs of the exposed conductive routing structures 220. Moreover, as shown in this example, some of the digital circuits are programmed differently for different die areas 201. This example illustrates the flexibility of the described process 100 to allow some dies to be configured one way, and other dies to be configured differently with respect to programming of the digital circuits 310. This example also shows that the analog circuits 300 of different dies 201 can be configured differently on a single wafer 200. FIG. 8 shows an example singulated die 201 of the wafer 200 of FIGS. 6 and 7.

Described examples provide significant advantages over other analog and digital circuit trimming or programming techniques. For example, the described examples do not require significant die space, especially compared with EEPROM, OTP and/or poly fuse approaches. Also, the described methods do not require complex interconnection of circuit components or associated additional metallization structure layers compared with other circuit trimming or programming techniques. The described examples are useful for any suitable trimming or programming tasks during manufacturing of an integrated circuit or microelectronic devices, such as configuration of temperature measurement circuits, reference voltage circuits, current measurement circuits, timing (e.g., clock) reference circuits or the like. Moreover, the described examples are useful to create different products from a single IC design by configuring specific functions, such as output stage topologies or specifications (e.g., regulated output voltage or detection thresholds). Examples use printed metals, conductive polymers or other electrically conductive/semiconductive/resistive material 224, 400, 500 to create jumpers to replace traditional nonvolatile memories for trimming or other configuration of circuits at the wafer level. The described examples also provide flexibility to allow unique configuration of each die on a wafer, based upon probe level measurements and/or according to a predetermined production plan. The described examples further provide enhanced circuit reliability through the use of additive deposition. Compared with polysilicon fuse techniques, in which a polysilicon structure is fabricated during wafer processing and thereafter subjected to high currents or laser cutting to "blow" or open circuit the fuse, the described examples do not suffer from the possibility of re-growing a fuse or laser link. The described examples also provide wide tolerance for variation of resistance/impedance of a particular connection. Also, the described examples provide flexibility for a variety of different trimming and/or programming functions at very low cost, without additional masking layers to create new components. Example implementations also facilitate expedited manufacturing, where various spray or printing additive deposition implementations can print a 300 mm wafer 200 in less than five minutes with a unique pattern for each die 201.

Modifications are possible in the described embodiments, and other embodiments are possible, within the scope of the claims.

What is claimed is:

1. An integrated circuit, comprising:
   a semiconductor substrate;
   a circuit including: one or more electronic components on the semiconductor substrate; and electrical contacts coupled to the one or more electronic components;
   a metallization structure on the circuit, the metallization structure having an unplanarized surface with valleys, and the metallization structure including:
       dielectric material;
       a first conductive routing structure in the dielectric material, the first conductive routing structure is electrically connected to one of the electrical contacts; and
       a second conductive routing structure in the dielectric material; and
   an additively deposited material over the unplanarized surface, the additively deposited material is coupled to the first and second conductive routing structures and at least some of the additively deposited material is within the valleys of the unplanarized surface.

2. The integrated circuit of claim 1, wherein the additively deposited material includes conductive material.

3. The integrated circuit of claim 1, wherein the additively deposited material includes resistive material.

4. The integrated circuit of claim 1, wherein the additively deposited material includes semiconductor material.

5. The integrated circuit of claim 1, further comprising a passivation layer between the metallization structure and the additively deposited material.

6. The integrated circuit of claim 1, further comprising a passivation layer over the additively deposited material.

7. The integrated circuit of claim 2, wherein the conductive material forms a conductive jumper.

8. The integrated circuit of claim 3, wherein the resistive material forms a resistor.

9. The integrated circuit of claim 3, wherein the resistive material forms a fuse.

10. The integrated circuit of claim 9, wherein the fuse is a blown fuse.

11. The integrated circuit of claim 1, wherein the second conductive routing structure is electrically connected to another of the electrical contacts.

12. An integrated circuit, comprising:
    a semiconductor substrate;
    first and second circuits over the semiconductor substrate;
    a metallization structure over the first and second circuits and including: dielectric material;
        a first conductive routing structure in the dielectric material, the first conductive routing structure is electrically connected to the first circuit;
        a second conductive routing structure in the dielectric material;
        a third conductive routing structure in the dielectric material, the third conductive routing structure is electrically connected to the second circuit;
        a fourth conductive routing structure in the dielectric material;
    a first additively deposited structure over the metallization structure, the first additively deposited structure is coupled to the first and second conductive routing structures; and
    a second additively deposited structure over the metallization structure, the second additively deposited structure is coupled to the third and fourth conductive routing structures.

13. The integrated circuit of claim 12, wherein the first circuit includes an analog circuit, and the second circuit includes a digital circuit.

14. The integrated circuit of claim 12, wherein the first circuit is a passive circuit and the second circuit is an active circuit.

15. The integrated circuit of claim 12, wherein:
    the first additively deposited structure includes one of a first resistor, a first conductive jumper, a first fuse, or a first semiconductor structure; and
    the second additively deposited structure includes one of a second resistor, a second conductive jumper, a second fuse, or a second semiconductor structure.

16. A wafer structure, comprising:
    a first die area including:
        a semiconductor substrate;
        a first circuit over the semiconductor substrate;
        a first metallization structure over the first circuit and including:
            dielectric material;
            a first conductive routing structure in the dielectric material, the first conductive routing structure is electrically connected to the first circuit; and a second conductive routing structure in the dielectric material; and a first additively deposited structure over the first metallization structure, the first additively deposited structure is coupled to the first and second conductive routing structures;

a second die area including:
  the semiconductor substrate;
  a second circuit over the semiconductor;
  a second metallization structure over the second circuit and including:
    the dielectric material;
    a third conductive routing structure in the dielectric material, the third conductive routing structure is electrically connected to the second circuit; and
    a fourth conductive routing structure in the dielectric material; and
  a second additively deposited structure over the second metallization structure, the second additively deposited structure is coupled to the third and fourth conductive routing structures.

17. The wafer structure of claim 16, wherein the first circuit includes a first digital circuit, and the second circuit includes a second digital circuit that is differently configured than the first digital circuit.

18. The wafer structure of claim 16, wherein:
the second conductive routing structure is electrically connected to another of the first electrical contacts, and the first circuit is a passive circuit; and
the second circuit is an active circuit.

19. The wafer structure of claim 16, wherein:
the first additively deposited structure includes one of a first resistor, a first conductive jumper, a first fuse, or a first semiconductor structure; and
the second additively deposited structure includes one of a second resistor, a second conductive jumper, a second fuse, or a second semiconductor structure.

\* \* \* \* \*